US007851897B1

(12) United States Patent
Cate et al.

(10) Patent No.: US 7,851,897 B1
(45) Date of Patent: Dec. 14, 2010

(54) IC PACKAGE STRUCTURES FOR HIGH POWER DISSIPATION AND LOW RDSON

(75) Inventors: Steven D. Cate, Los Altos, CA (US);
Ajay Kumar Ghai, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 12/485,747

(22) Filed: Jun. 16, 2009

Related U.S. Application Data

(60) Provisional application No. 61/061,770, filed on Jun. 16, 2008.

(51) Int. Cl.
*H01L 29/76* (2006.01)
(52) U.S. Cl. ..................................... 257/678
(58) Field of Classification Search ......... 257/678–733,
257/341, 787–796, 704, 710, E23.001–E23.194,
257/666–667, E27.03–E27.032, E27.109,
257/E29.194–E29.225, 163–166, 197, 205,
257/273, 351, 361, 423, 427, 474, 477, 517,
257/516, 539, 544, 565–593, 928, E51.004,
257/E31.069, E27.037–E27.043, E27.053–E27.058,
257/E27.074–E27.078, E27.106, E27.149;
257/E29.03–E29.035, E29.044–E29.045,
257/E29.066–E29.067, E21.608–E21.613,
257/E21.369–E21.393, 262, 368–401, E29.255–E29.313,
257/E29.315–E29.316, E21.409–E21.449,
257/E21.334–E21.346, E21.473, 302, 328,
257/27.02, E29.182–E29.183, E29.187, E29.189,
257/E29.318, 675; 438/15, 26, 51, 55, 64,
438/106, 124–127, 202–208, 234–239, 170,
438/189, 309–378, 135, 151, 197, 199, 201,
438/207, 216
See application file for complete search history.

(56) References Cited

U.S. PATENT DOCUMENTS

| | | | | |
|---|---|---|---|---|
| 6,225,703 B1 * | 5/2001 | Umehara et al. | ............ | 257/787 |
| 6,559,525 B2 * | 5/2003 | Huang | ......... | 257/675 |
| 6,777,800 B2 * | 8/2004 | Madrid et al. | ............... | 257/690 |
| 7,105,931 B2 * | 9/2006 | Attarwala | .................... | 257/783 |
| 7,141,867 B2 * | 11/2006 | Tao et al. | ..................... | 257/666 |
| 7,504,733 B2 * | 3/2009 | Lopez | ......... | 257/778 |
| 7,514,731 B2 * | 4/2009 | Shiraishi et al. | ............. | 257/288 |
| 2001/0048154 A1 * | 12/2001 | Cheah et al. | ................ | 257/723 |
| 2002/0008319 A1 * | 1/2002 | Davis et al. | ................ | 257/723 |
| 2002/0127775 A1 * | 9/2002 | Haba et al. | .................. | 438/109 |
| 2004/0070055 A1 * | 4/2004 | Punzalan et al. | ........... | 257/666 |
| 2005/0212116 A1 * | 9/2005 | Shimanuki et al. | ......... | 257/702 |

* cited by examiner

*Primary Examiner*—Dao H Nguyen
*Assistant Examiner*—Tram H Nguyen
(74) *Attorney, Agent, or Firm*—Blakely Sokoloff Taylor & Zafman LLP

(57) ABSTRACT

IC package structures for high power dissipation and low RDSon. The package can be considered an inverted QFN package typically manufactured from a double etched lead frame that is then formed (stamped) to receive the electronic devices for connection and wire bonding to the lead frame leads, followed by potting and dicing. Using a split paddle allows the packaging of multiple, electrically isolated power devices. The package is particularly advantageous for packaging vertical power MOSFET devices. Various embodiments are disclosed.

12 Claims, 6 Drawing Sheets

IC PACKAGE STRUCTURES FOR HIGH POWER DISSIPATION AND LOW RDSON

CROSS-REFERENCE TO RELATED APPLICATION

This application claims the benefit of U.S. Provisional Patent Application No. 61/061,770 filed Jun. 16, 2008.

BACKGROUND OF THE INVENTION

1. Field of the Invention

The present invention relates to the field of semiconductor device packaging.

2. Prior Art

High power devices require means to conduct high amounts of currents, low RDSon (drain-source resistance when the device is turned on), and means to efficiently remove heat. Also, products using vertical MOSFETs require that electrical contact be made on both top and bottom sides of the structure. Integrating more than one MOSFET may require that current output from one MOSFET be input in series into the second MOSFET while a controller die manages functions of both MOSFETs. In this case, both MOSFETs need to be electrically isolated from each other as well as the controller die.

A QFN package, known in the art, is defined as a "Quad, flat, no-lead" package. The package generally uses a flat lead frame having a central area surrounded by leads that are cut off and separated from the center section, referred to as a pad or paddle, after molding plastic around the packaged device. Solder bumping is used for mounting on the next assembly. The center section may be used as a ground plane, for heat conduction out of the package, or both.

DETAILED DESCRIPTION OF THE PREFERRED EMBODIMENTS

As previously mentioned, high power devices require means to conduct high amount of currents, low RDSon, and means to remove heat efficiently. Also, products using vertical MOSFETs require that electrical contact be made on both top and bottom sides of the structure. Integrating more than one MOSFET may require that output from one MOSFET be input in series into the second MOSFET while a controller die manages functions of both MOSFETs. In this case, both MOSFETs need to be electrically isolated from each other as well as the controller die. This package design meets all the requirements in an efficient manner.

The integrated circuit package structure of the present invention is perhaps best described through an exemplary process of making the same. Thus in FIG. 1, part of a larger array of lead frames for an exemplary embodiment may be seen. In this embodiment, each lead frame is characterized by first and second split paddles 20 and 22 and a plurality of contacts 26, all integrally joined around the perimeter of each lead frame to provide a self supporting, multiple lead, split paddle lead frame array. Some of the contacts 26 are supported around the periphery of the lead frame, though not connected or integral with either of the split paddles, whereas other contacts 26' are both supported around the periphery of the respective lead frame and extend inward to be integrally connected to a respective one of the split paddles 20 and 22. Each paddle 20 and 22 is also each supported at two respective corners thereof by angled connections 28, and at the other two corners thereof by a region 30' connected to a contact 26'.

Figure 1:
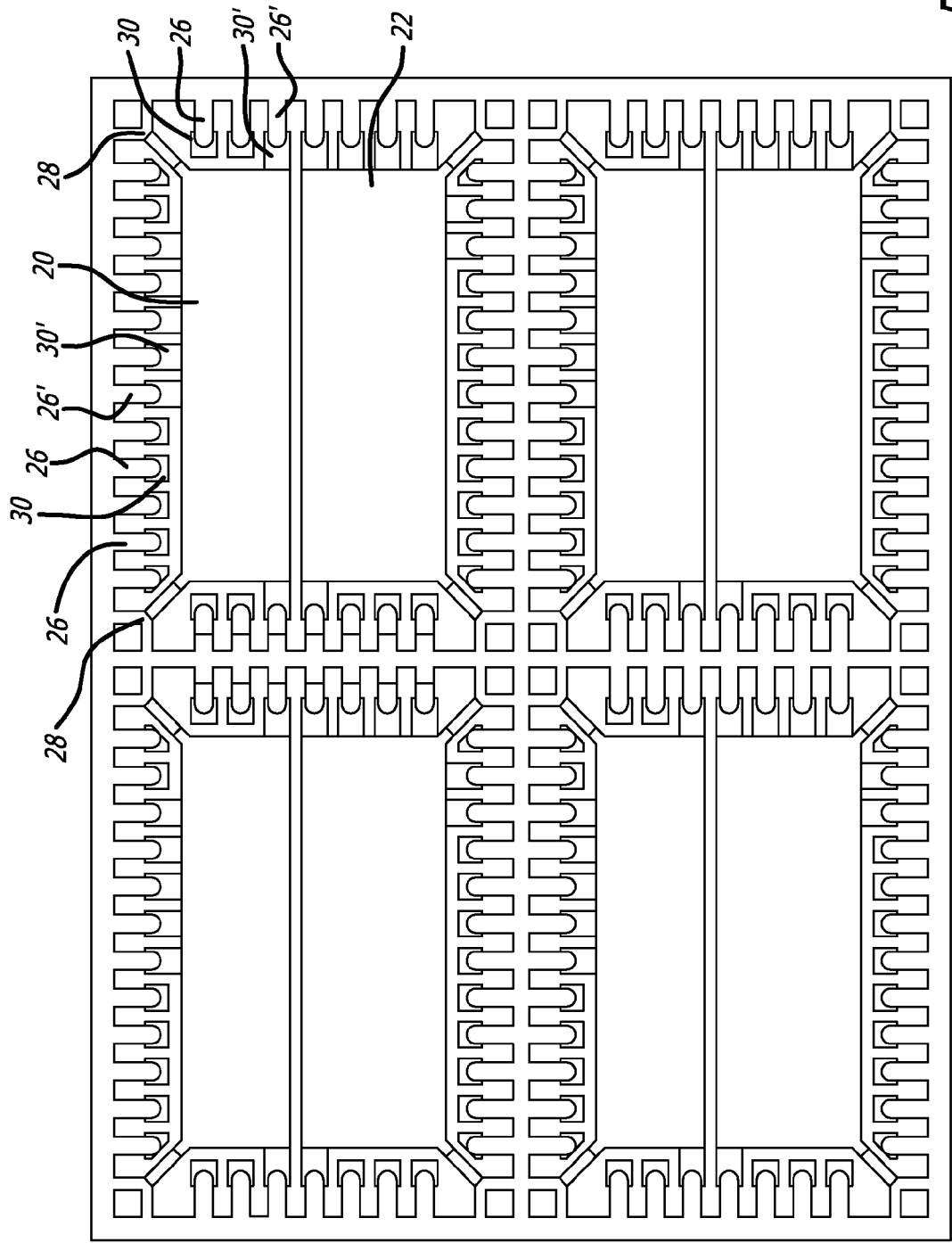
FIG. 1 illustrates part of an array of lead frames for an exemplary embodiment of the invention.

In general, a thicker copper sheet will be used to form the array of lead frames as in FIG. 1 than is used for conventional lead frames. The contacts 26 and the split paddles 20 and 22 have the thickness of the initial copper sheet. The regions 30 integral with but behind the contacts 26 are thinner than the thickness of the initial copper sheet, as are the regions 30' behind and integral with the contacts 26' and the respective paddle. Also in a preferred embodiment, the corner members 28 are thinned up from the Y shape to a location adjacent the respective paddle. The thinning in a preferred embodiment reduces the local thickness of the copper sheet material by approximately 50%.

Figure 2:
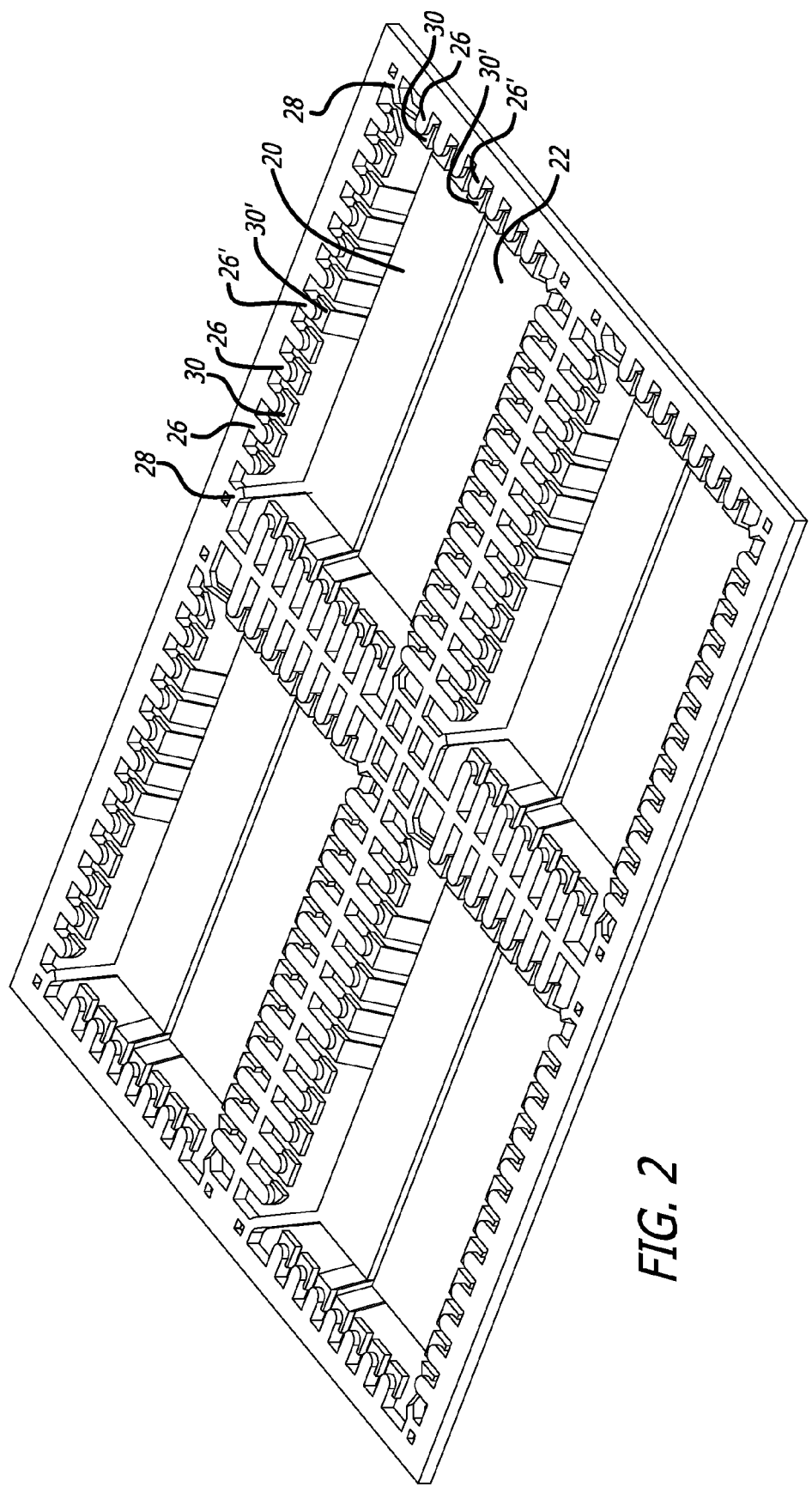
FIG. 2 illustrates the lead frame array of FIG. 1 after stamping to lower the plane of the surfaces of the paddles relative to the plane of the contact surfaces.

The array of lead frames may be formed by a two step etching process, namely a first mask and etch to thin the regions 30, 30' and the connection to the corners 28, and then a second mask and etch to remove the metal in other regions in accordance with the pattern of the lead frame array. After etching, the lead frame array is stamped to lower the plane of the surfaces of the paddles 20 and 22 relative to the plane of the contact surfaces, as shown in FIG. 2. In this operation, the thinner areas connecting contacts 26' and the respective paddles and the four connections of corners 28 to the paddles bend and stretch (are drawn), but the thicker areas are not distorted, in part because the metal used is not subject to significant work hardening during the drawing process, and in part because the thicker areas may be retained (fixtured) as needed to prevent their inadvertent movement during stamping.

Figure 3:
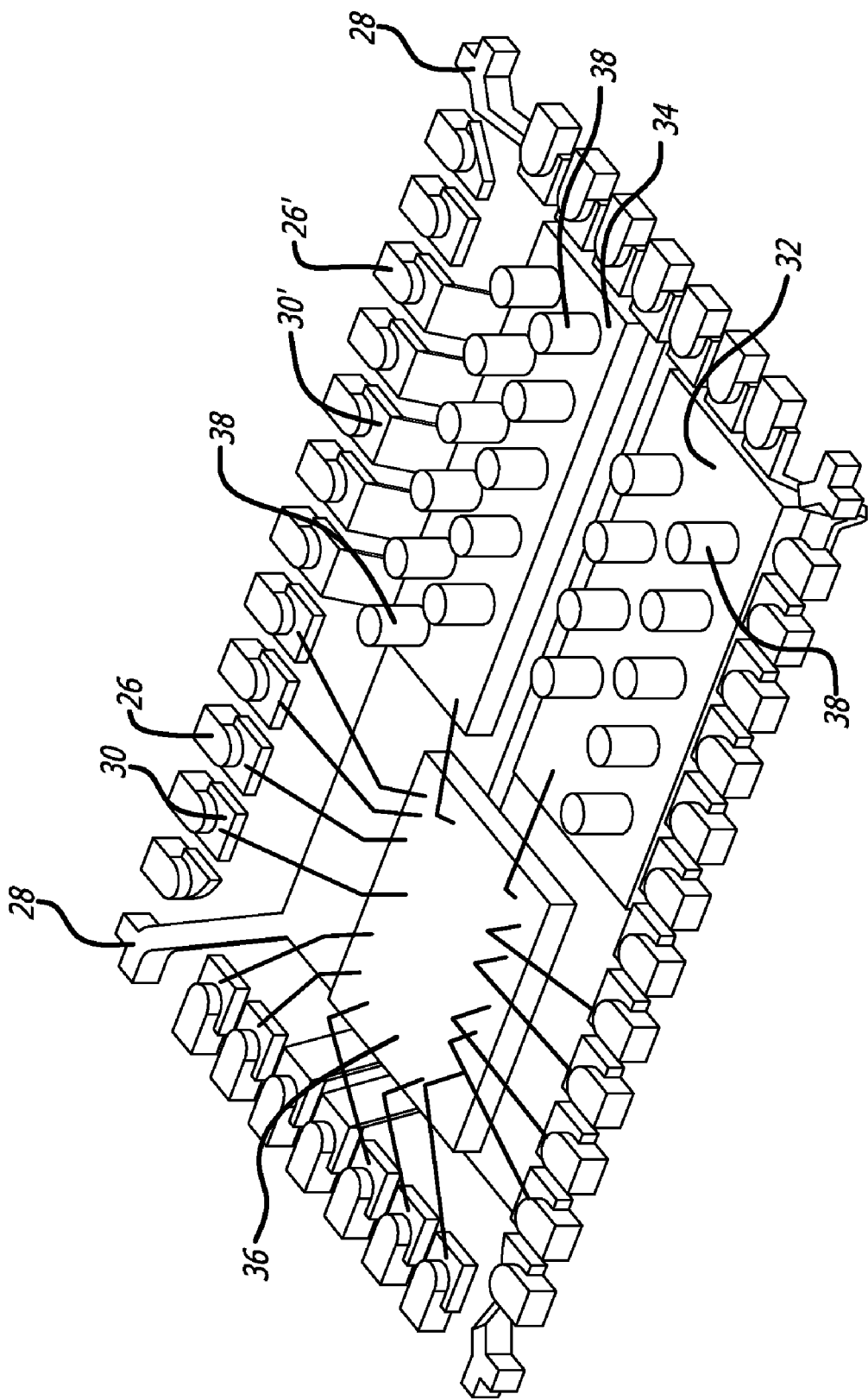
FIG. 3 illustrates an embodiment of the present invention having two vertical power MOSFETs(32,34), each mounted on a respective paddle, and a controller chip 36, typically insulated from the paddles and having die contact pads wire bond connected to the thinner portion of some of package contacts and to the gate connections of the two vertical power MOSFETs.

The next step in the packaging is to mount the devices on the paddles and wire bond the devices to each other and to the thinner portions of contacts 26 as required. FIG. 3 illustrates an embodiment having two vertical power MOSFETs 32 and 34, each mounted on a respective paddle 20 and 22, and a controller chip 36, typically insulated from the paddles and having contacts wire bonded to the thinner portion of some of contacts 26 and to the gate connections of the two vertical power MOSFETs 32 and 34. Note that FIG. 3 illustrates the lead frame as it appears in the finished package to better illustrate the wire bonding and final contacts, though mounting of the electronic devices and wire bonding will be done when the leads frames are still joined as in FIG. 2. Each of the two vertical power MOSFETs 32 and 34 is mounted on a respective paddle 20 and 22 in a manner to provide a good electrical contact with the respective paddle, in a preferred embodiment by direct solder attach or conductive epoxy attach of each MOSFET to the respective paddle. Note that good electrical connection is directly communicated to the lead frame contacts 26' through the use of multiple leads 30' and associated contacts 26'. Alternatively, one could use fewer, wider or even a single, wide lead 30' and contact 26' for the low resistance connection between the MOSFET devices and the contacts 26', though that is not preferred. One application of such a package is for switching power supplies, wherein the controller chip is the switching power supply controller, and the two power MOSFETs are the high side and the low side switches.

Also shown in FIG. 3 are copper pillars 38 for connecting the upper contact on each MOSFET to solder ball contacts on the finished package. The copper pillars 38 are formed as a wafer stage process before the wafer is diced by directly electroplating to the upper MOSFET contacts through an appropriate mask as is well known in the art, dimensions being chosen so that the top of the pillars will be coplanar with the surfaces of contacts 26 and 26'.

Figure 4:
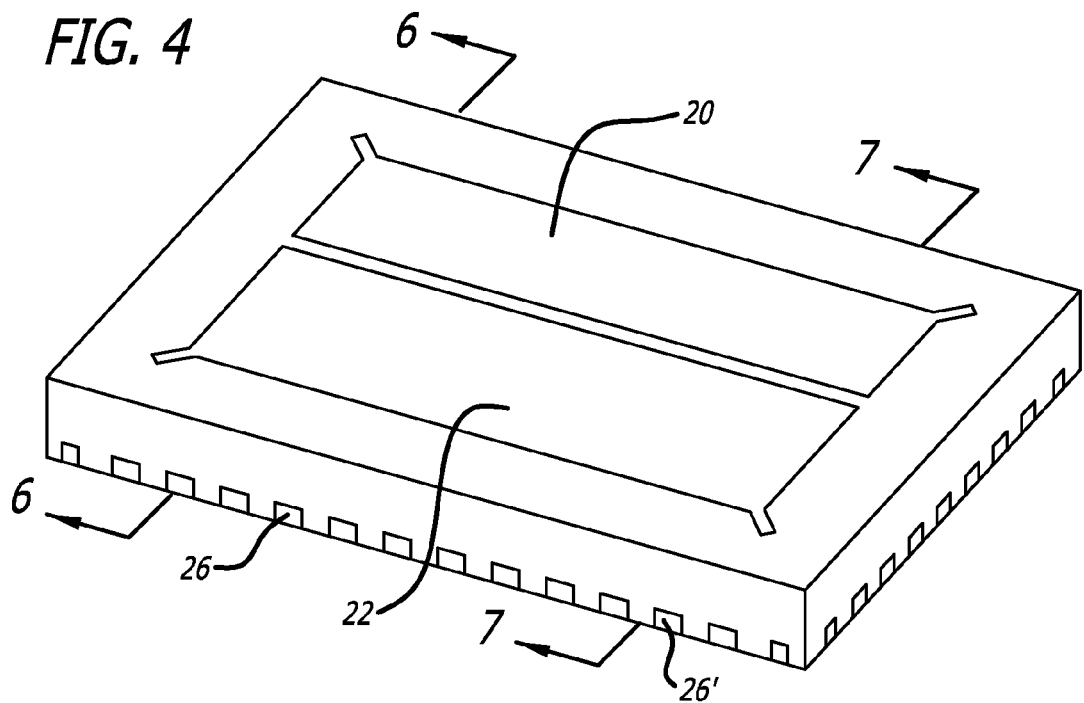
FIG. 4 is a perspective view of the finished package illustrating the top of the finished package.
Figure 5:
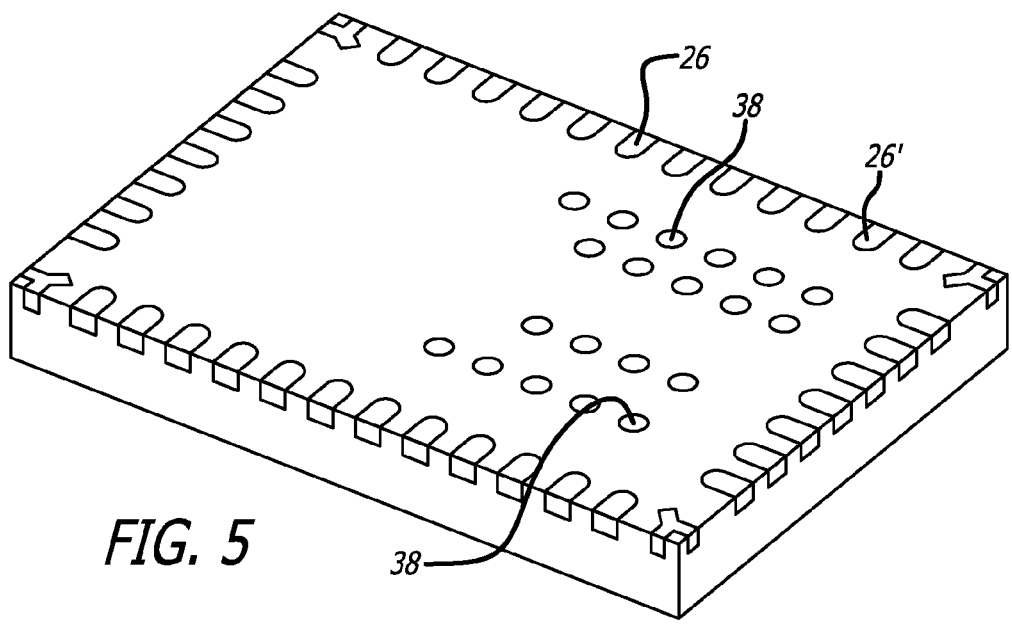
FIG. 5 is perspective view of the finished package illustrating the bottom of the finished package.

The packaging is completed by potting the devices, leaving the contacts 26 and 26' and the top of the copper pillars 38 exposed, solder bumping the contacts and then dicing the assembly to separate the packaged devices and to separate the contacts 26 and 26' from the lead frames. In use, the finished package is turned upside down compared to the orientation shown in FIGS. 1-3, and solder ball mounted to a printed circuit board. FIGS. 4 and 5 are perspective views of the finished package illustrating the top and bottom (bottom and top using the orientation of FIGS. 1-3) of the finished package. The exposed surface of the split paddles 20 and 22 provides excellent thermal conduction from the MOSFETs for coupling to a heat sink.

Figure 6:
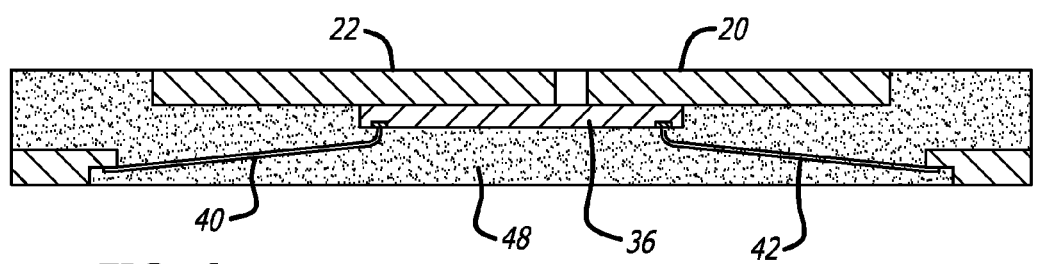
FIG. 6 is an irregular cross section through the finished package taken through a pair of contacts and through wire bonds 40 on the controller chip.
Figure 7:
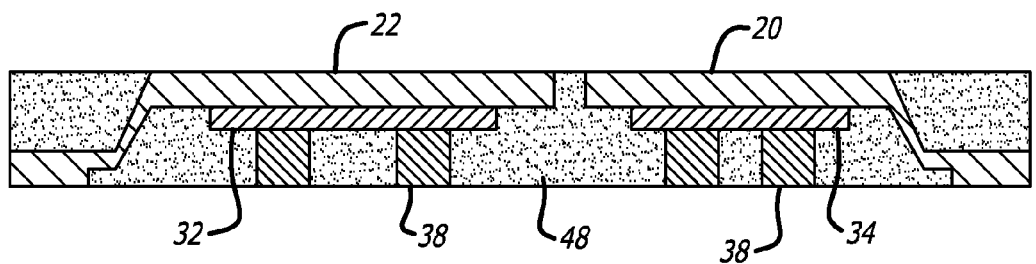
FIG. 7 is a cross section through the two MOSFETs, a pair of copper pillars, two contacts and associated inclined regions illustrating the structure in that area of the final package.

FIG. 6 is an irregular cross section through the finished package of FIG. 4 taken through a pair of contacts 26 and through wire bonds 40 and 42 on the controller chip 36. This Figure illustrates one of the significances of the initial thinning etch. In particular, the thinned region 30 on contacts 26 allows wire bonding at an elevation below the surface of contacts 26, so that the wire bonds become buried in the potting compound 48. FIG. 7 is a cross section through the two MOSFETs 32 and 34 of the package, a pair of copper pillars 38, two contacts 26' and associated inclined regions 30' of the finished package of FIG. 4 illustrating the structure in that area of the final package.

Figure 8:
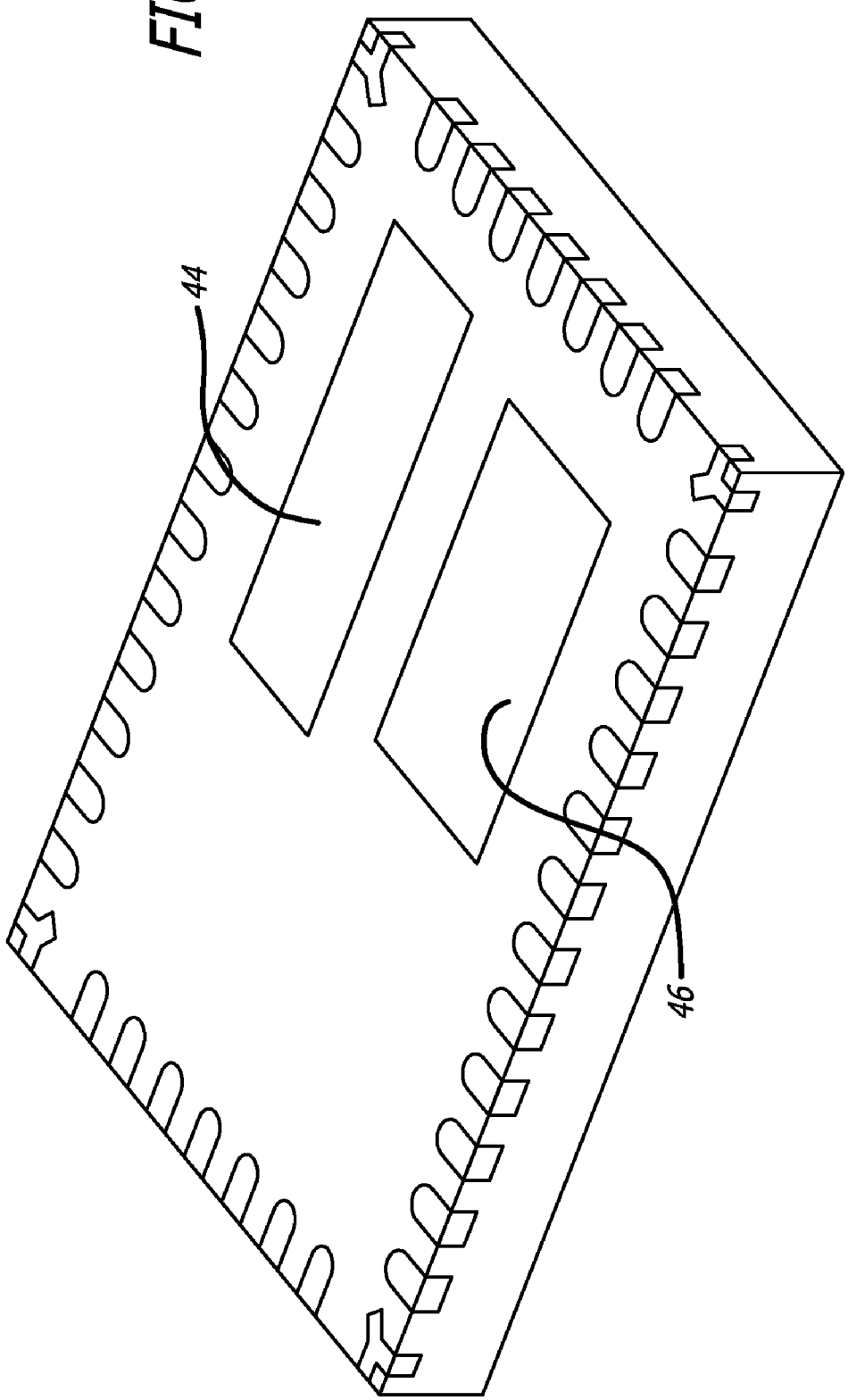
FIG. 8 is a bottom view of an alternate embodiment of the present invention.

FIG. 8 is a bottom view of an alternate embodiment. In this embodiment, instead of the copper pillars 38 of the earlier embodiment, copper plates 44 and 46 are electrically coupled to the top connections of the vertical MOSFETs, or alternatively, directly deposited or plated onto the MOSFETs.

As further alternate embodiments, the two vertical MOSFETs may be stacked, one on top of the other, on a single paddle, using either the copper pillar package configuration of FIG. 5 or the copper plate configuration of FIG. 8. This provides a compact package having a minimum footprint, though also has certain disadvantages. It requires a deeper draw in the stamping operation. It also would require heat transfer from the lower MOSFET through the upper MOSFET, assuming the primary heat path from the package is out of the top of the finished package. Further, many typical applications for a pair of power MOSFETs, such as high side and low side power devices in switching power supplies and H-bridge drivers, would require a high current contact for the common connection between the two MOSFETs, only conveniently made by wire bonding. However wire bonding would provide a higher resistance contact than desired, somewhat negating the purpose of the package. If stacking of two MOSFETs was used, then a somewhat larger split paddle package could package four MOSFETs to make a complete H-bridge.

While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. An electronics package comprising:
   a plurality of electrical contacts on the periphery of a first face of the electronics package;
   a first surface of at least one paddle on a second face of the electronics package opposite the first face and integrally connected to some of the plurality of electrical contacts on the periphery of the first face of the electronics package;
   at least one vertical electronic device having electrical contacts on first and second faces thereof, the first face of the vertical electronic device being mounted with the electrical package on a second surface of the paddle and electrically connected to the paddles, at least additional electrical contact on the first face of the electronics package immediately opposite the second face of the vertical electronic device and connected to the electrical contact on the second face of the vertical electronic device.

2. The electronics package of claim 1 wherein the at least one additional electrical contact on the first face of the electronics package directly connected to the electrical contact on the face of the vertical electronic device opposite the paddle comprises a plurality of copper pillars.

3. The electronics package of claim 1 wherein the at least one additional electrical contact on the first face of the electronics package directly connected to the electrical contact on the face of the vertical electronic device opposite the paddle comprises a copper plate.

4. The electronics package of claim 1 further comprising a controller, the controller also being mounted at least in part on the second surface of the paddle and wire bonded to at least some of the contacts around the periphery of the first face of the electronics package and to the vertical electronic device.

5. The electronics package of claim 1 wherein:
   the second face of the electronics package has a first surface of at least two paddles on the second face of the electronics package;
   at least two electronic devices, each electronic device having a first electronic device face mounted within the electronics package on a second surface of a respective paddle, each paddle being integrally connected to at least one of the plurality of electrical contacts around the periphery of a first face of the electronics package;
   the at least two electronic devices having some electrical connections coupled to some of the plurality of electrical contacts around the periphery of a first face of the electronics package.

6. The electronics package of claim 5 wherein the at least two electronic devices are vertical devices having electrical contacts on first and second faces thereof, and further comprising at least two additional electrical contacts on the first face of the electronics package, each additional electrical contact being connected to the electrical contact on the face of a respective vertical electronic device opposite the paddle.

7. The electronics package of claim 6 wherein the at least two additional electrical contacts on the first face of the electronics package connected to the electrical contact on the face of a respective vertical electronic device comprises a plurality of copper pillars.

8. The electronics package of claim 6 wherein the at least two additional electrical contacts on the first face of the electronics package connected to the electrical contact on the face of a respective vertical electronic device comprises at least two copper plates.

9. The electronics package of claim 6 wherein the at least two electronic vertical devices further comprise a controller, the controller also being mounted at least in part on second surface of at least one of the paddles and being wire bonded to at least some of the contacts around the periphery of a first face of the electronics package and to the vertical electronic devices, electrical connections on the at least two vertical electronic devices being coupled to some of the plurality of electrical contacts around the periphery of a first face of the electronics package through the controller.

10. An electronics package comprising:
- a plurality of electrical contacts on the periphery of a first face of the electronics package;
- a first surface of a pair of paddles on a second face of the electronic package opposite the first face;
- two vertical electronic devices having electrical contacts on first and second faces thereof, each having a first electronic device face mounted within the electronics package on a second surface of a respective paddle and being electrically connected to the respective paddle, the paddles each being integrally connected to some respective electrical contacts around the periphery of a first face of the electronics package;
- a plurality of additional electrical contacts on the first face of the electronics package, each connected to the electrical contact on the face of a respective one of the vertical electronic devices opposite the paddles;
- a controller, the controller also being mounted at least in part on the second surface of a paddle and being wire bonded to at least some of the contacts around the periphery of the first face of the electronics package and to the vertical electronic devices.

11. The electronics package of claim 10 wherein the plurality of additional electrical contacts on the first face of the electronics package, each connected to the electrical contact on the face of a respective one of the vertical electronic devices opposite the paddle comprise a plurality of copper pillars.

12. The electronics package of claim 10 wherein the plurality of additional electrical contacts on the first face of the electronics package, each connected to the electrical contact on the face of a respective one of the vertical electronic devices opposite the paddle comprise copper plates.

* * * * *